United States Patent
Ryu

(10) Patent No.: US 9,721,901 B2
(45) Date of Patent: Aug. 1, 2017

(54) THIN-FILM TRANSISTOR SUBSTRATE, DISPLAY APPARATUS, METHOD OF MANUFACTURING THIN-FILM TRANSISTOR SUBSTRATE, AND METHOD OF MANUFACTURING DISPLAY APPARATUS

(71) Applicant: Samsung Display Co., Ltd., Yongin-si, Gyeonggi-Do (KR)

(72) Inventor: Jihyeon Ryu, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/643,035

(22) Filed: Mar. 10, 2015

(65) Prior Publication Data

US 2016/0086892 A1   Mar. 24, 2016

(30) Foreign Application Priority Data

Sep. 19, 2014   (KR) .................. 10-2014-0125249

(51) Int. Cl.
| | | |
|---|---|---|
| *H01L 23/544* | (2006.01) | |
| *H01L 27/12* | (2006.01) | |
| *H01L 29/66* | (2006.01) | |
| *H01L 29/786* | (2006.01) | |

(52) U.S. Cl.
CPC ........ *H01L 23/544* (2013.01); *H01L 27/1222* (2013.01); *H01L 27/1225* (2013.01); *H01L 27/1259* (2013.01); *H01L 29/66969* (2013.01); *H01L 2223/54413* (2013.01); *H01L 2223/54433* (2013.01); *H01L 2223/54453* (2013.01); *H01L 2924/0002* (2013.01)

(58) Field of Classification Search
CPC ............ H01L 23/544; H01L 2223/544; H01L 2223/54433; H01L 2223/54426; H01L 2223/54453
USPC ......................................... 257/797
See application file for complete search history.

(56) References Cited

U.S. PATENT DOCUMENTS

| | | |
|---|---|---|
| 2003/0225473 A1 | 12/2003 | Yamazaki |
| 2005/0161836 A1* | 7/2005 | Yudasaka ............. H01L 23/544 257/797 |
| 2008/0136993 A1 | 6/2008 | Jeong et al. |
| 2009/0206411 A1* | 8/2009 | Koketsu ............... H01L 23/544 257/368 |

FOREIGN PATENT DOCUMENTS

| | | |
|---|---|---|
| JP | 2004-72075 A | 3/2004 |
| KR | 10-2005-0068510 A | 7/2005 |
| KR | 10-2006-0018765 A | 3/2006 |
| KR | 10-2008-0042423 A | 5/2008 |
| KR | 10-2014-0055531 A | 5/2014 |

\* cited by examiner

*Primary Examiner* — Jerome Jackson, Jr.
*Assistant Examiner* — David Spalla
(74) *Attorney, Agent, or Firm* — Robert E. Bushnell, Esq.

(57) ABSTRACT

Disclosed is a thin-film transistor substrate including: a substrate; a thin-film transistor formed on the substrate and including an active layer, a gate electrode, a source electrode, and a drain electrode; an identification (ID) mark formed on the substrate; and a metal layer contacting an upper surface of the ID mark.

20 Claims, 11 Drawing Sheets

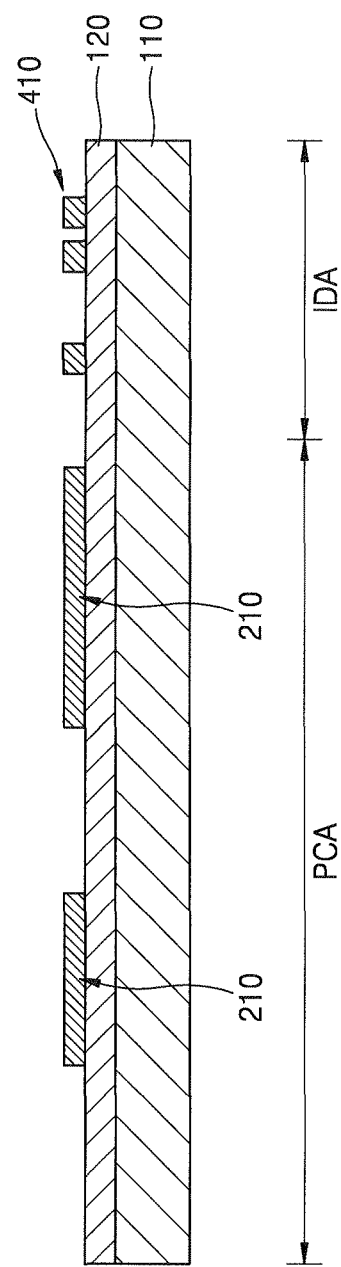

THIN-FILM TRANSISTOR SUBSTRATE, DISPLAY APPARATUS, METHOD OF MANUFACTURING THIN-FILM TRANSISTOR SUBSTRATE, AND METHOD OF MANUFACTURING DISPLAY APPARATUS

CLAIM PRIORITY

This application makes reference to, incorporates the same herein, and claims all benefits accruing under 35 U.S.C. §119 from an application earlier filed in the Korean Intellectual Property Office on 19 Sep. 2014 and there duly assigned Serial No. 10-2014-0125249.

BACKGROUND OF THE INVENTION

1. Field of the Invention

One or more exemplary embodiments relate to a thin-film transistor substrate, a display apparatus, a method of manufacturing the thin-film transistor substrate, and a method of manufacturing the display apparatus.

2. Description of the Related Art

Display apparatuses are apparatuses for displaying images, and organic light-emitting display apparatuses have recently drawn attention.

Unlike liquid crystal display apparatuses, the organic light-emitting display apparatuses have self-emitting characteristics and do not require a separate light source. Therefore, thicknesses and weights thereof may be reduced. In addition, the organic light-emitting display apparatuses exhibit high grade characteristics such as low power consumption, high brightness, and quick response times.

Display apparatuses such as organic light-emitting display apparatuses and liquid crystal display apparatuses are inspected during or after a manufacturing process, wherein an identification mark is provided on a pixel or a display apparatus to be inspected.

The above information disclosed in this Related Art section is only for enhancement of understanding of the background of the invention and therefore it may contain information that does not form the prior art that is already known to a person of ordinary skill in the art.

SUMMARY

One or more exemplary embodiments include a thin-film transistor substrate, a display apparatus, a method of manufacturing the thin-film transistor substrate, and a method of manufacturing the display apparatus.

Additional aspects will be set forth in part in the description which follows and, in part, will be apparent from the description, or may be learned by practice of the presented embodiments.

According to one or more exemplary embodiments, a thin-film transistor substrate includes: a substrate; a thin-film transistor formed on the substrate and including an active layer, a gate electrode, a source electrode, and a drain electrode; an identification (ID) mark formed on the substrate; and a metal layer contacting an upper surface of the ID mark.

The thin-film transistor substrate may further include at least one insulating layer covering the ID mark, wherein the at least one insulating layer includes a hole through which the upper surface of the ID mark is exposed, and the metal layer contacts the upper surface of the ID mark through the hole.

The ID mark may be formed in the same layer as the active layer of the thin-film transistor.

The active layer may include source and drain regions disposed at both sides of a channel region and doped with impurities, and the ID mark may include the same material as the source and drain regions.

The metal layer may be formed of the same material and in the same layer as the source and drain electrodes of the thin-film transistor.

The ID mark may be formed for each pixel area included in the thin-film transistor substrate.

A size of the metal layer may be equal to or greater than that of the ID mark.

According to one or more exemplary embodiments, a display apparatus includes: a substrate; a thin-film transistor formed on the substrate and including an active layer, a gate electrode, a source electrode, and a drain electrode; a first insulating layer interposed between the active layer and the gate electrode; a second insulating layer formed below the source and drain electrodes; a pixel electrode electrically connected to one of the source electrode and the drain electrode; an identification (ID) mark formed on the substrate; and a metal layer contacting an upper surface of the ID mark.

The display apparatus may further include a hole penetrating through the first and second insulating layers, wherein the metal layer contacts an upper surface of the ID mark through the hole.

The ID mark may be patterned such that the ID mark has first information, and a partial region of the patterned ID mark may be filled with a material included in the first insulating layer.

The ID mark may be formed for each pixel, and the first information may contain information about a pixel for which the ID mark is formed.

The ID mark may be formed in the same layer as the active layer.

The metal layer may be formed of the same material and in the same layer as the source and drain electrodes.

According to one or more exemplary embodiments, a method of manufacturing a thin-film transistor substrate includes: forming an active layer on a substrate; forming an identification (ID) mark on the substrate; forming a first insulating layer on the active layer and the ID mark; forming a gate electrode on the active layer; forming a second insulating layer covering the gate electrode; forming source and drain electrodes contacting the active layer; and forming a metal layer contacting an upper surface of the ID mark.

The method may further include: forming a contact hole penetrating through the first and second insulating layers so as to expose a portion of the active layer before the forming of the source and drain electrodes; and forming a hole penetrating through the first and second insulating layers so as to expose the upper surface of the ID mark before the forming of the metal layer.

A size of the hole may be equal to or greater than that of the upper surface of the ID mark.

The ID mark may be formed in the same layer as the active layer.

The metal layer may be formed of the same material and in the same layer as the source and drain electrodes.

According to one or more exemplary embodiments, a method of manufacturing a display apparatus includes: manufacturing a thin-film transistor substrate by using the method described above; and forming a pixel electrode electrically connected to one of the source electrode and the drain electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 4A to 4G are cross-sectional views for describing a method of manufacturing a thin-film transistor substrate, according to an embodiment.

DETAILED DESCRIPTION OF THE INVENTION

Figure 1:
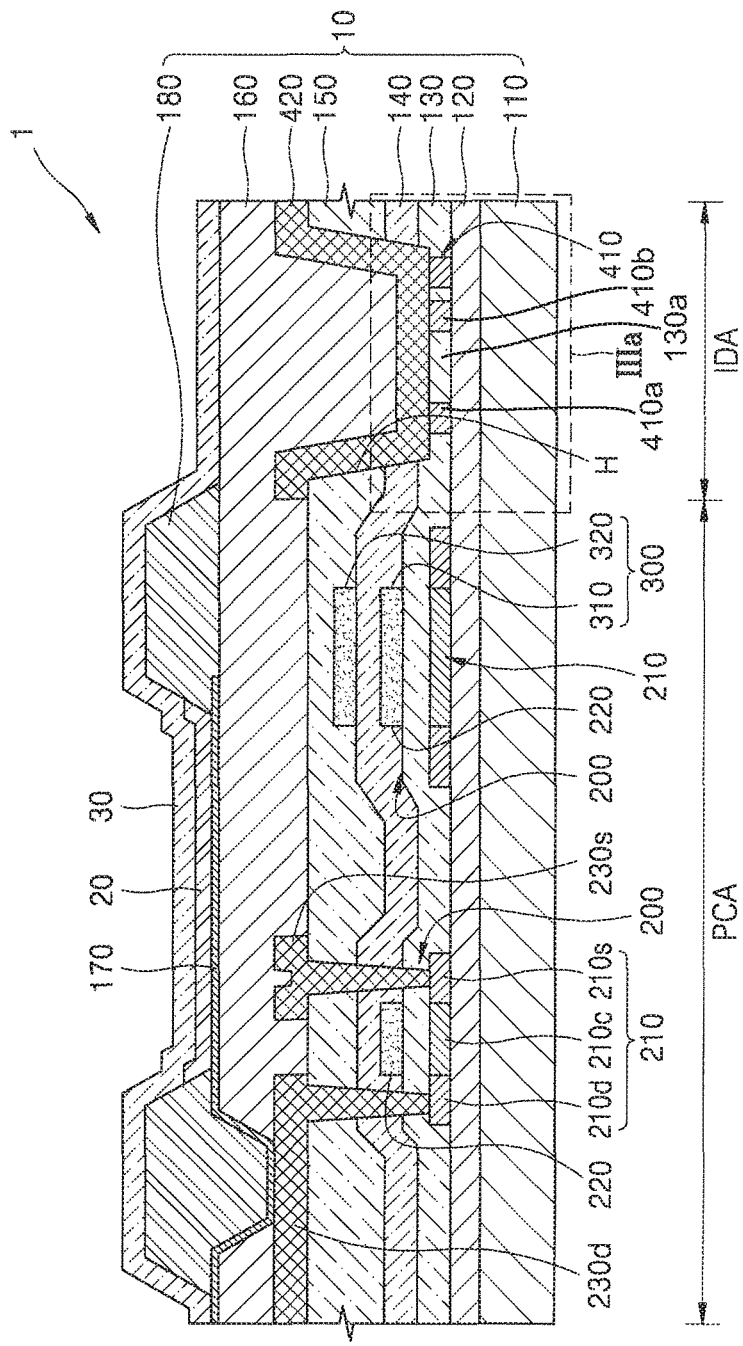
FIG. 1 is a cross-sectional view of a display apparatus including a thin-film transistor substrate, according to an embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Hereinafter, exemplary embodiments will be described in detail with reference to the accompanying drawings, and like reference numerals in the drawings denote like elements, and thus their repetitive description will be omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a display apparatus 1 including a thin-film transistor substrate 10, according to an exemplary embodiment of the inventive concept.

Referring to FIG. 1, the display apparatus 1 according to an exemplary embodiment of the inventive concept includes the thin-film transistor substrate 10, an intermediate layer 20 formed on a pixel electrode 170 of the thin-film transistor substrate 10 and including an organic emission layer, and an opposite electrode 30 formed on the intermediate layer 20.

The thin-film transistor substrate 10 includes a pixel circuit area PCA and an identification (ID) mark area IDA. A plurality of thin-film transistors 200 and a capacitor 300 are formed in the pixel circuit area PCA, and an ID mark 410 and a metal layer 420 are formed in the ID mark area IDA.

A substrate 110 has light-transmissivity (transparent) and may be formed of a glass material or a plastic material. The plastic material may be formed of various materials such as polyethylene terephthalate (PET), polyethylene naphthalate (PEN), and polyimide.

A buffer layer 120 may be formed on the substrate 110 to form a planar surface and to block infiltration of impurity elements. The buffer layer 120 may be formed of inorganic material(s) such as silicon nitride ($SiN_x$) and/or silicon oxide ($SiO_x$), in a single layer or multiple layers.

Each of the plurality of thin-film transistors 200 includes an active layer 210, a gate electrode 220, a source electrode 230s and a drain electrode 230d. Any one of the plurality of thin-film transistors 200 may be a driving thin-film transistor, and another one of the plurality of thin-film transistors 200 may be a switching thin-film transistor.

The active layer 210 may be formed of a semiconductor including amorphous silicon or crystalline silicon. The active layer 210 includes a channel region 210c and source and drain regions 210s and 210d disposed at both sides of the channel region 210c. The source and drain regions 210s and 210d are doped with ion impurities. Although it has been described in the present embodiment that the active layer 210 may be formed of amorphous silicon or crystalline silicon, the present embodiment is not limited thereto, and the active layer 210 may include an oxide semiconductor according to another embodiment.

On the active layer 210, the gate electrode 220 may be provided at a location corresponding to the channel region 210c of the active layer 210 by interposing a first insulating layer 130, which may be a gate insulating layer, between the active layer 210 and the gate electrode 220. The first insulating layer 130 may be formed of an inorganic material such as, for example, $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), or lead zirconate titanate (PZT). The gate electrode 220 may be formed of one or more metals selected from the group consisting of, for example, Al, platinum (Pt), palladium (Pd), silver (Ag), magnesium (Mg), gold (Au), nickel (Ni), neodymium (Nd), iridium (Ir), chromium (Cr), calcium (Ca), molybdenum (Mo), Ti, tungsten (W), and copper (Cu), in a single layer or multiple layers.

A second insulating layer 140 and a third insulating layer 150 which may be an interlayer insulating layer may be formed on the gate electrode 220. The second insulating layer 140 may be formed of an inorganic material such as, for example, $SiO_2$, $SiN_x$, SiON, $Al_2O_3$, $TiO_2$, $Ta_2O_5$, $HfO_2$, $ZrO_2$, BST, or PZT. The third insulating layer 150 may be formed of an inorganic material such as, for example, $SiO_2$, $SiN_x$, SiON, $Al_2O_3$, $TiO_2$, $Ta_2O_5$, $HfO_2$, $ZrO_2$, BST, or PZT, in a single layer or multiple layers.

The capacitor 300 may be formed overlapping any one of the plurality of thin-film transistors 200. In this case, a metal electrode layer facing a gate electrode 220 of the any one of the plurality of thin-film transistors 200 may be disposed on the gate electrode 220 of the any one of the plurality of thin-film transistors 200 by interposing the second insulating layer 140 therebetween, thereby forming an upper electrode 320 of the capacitor 300. The gate electrode 220 of the any one of the plurality of thin-film transistors 200 may also function as a lower electrode 310 of the capacitor 300 and a capacity may be determined by the second insulating layer 140.

The source electrode 230s and the drain electrode 230d respectively contacting the source region 210s and the drain region 210d of the active layer 210 are disposed on the gate electrode 220 by interposing the second insulating layer 140 and the third insulating layer 150 between the gate electrode 220 and the source and drain electrodes 230s and 230d. The source electrode 230s and the drain electrode 230d may be formed of one or more metals selected from the group consisting of Al, Pt, Pd, Ag, Mg, Au, Ni, Nd, Ir, Cr, lithium (Li), Ca, Mo, Ti, W, and Cu, in a single layer or multiple layers. Although not shown in FIG. 1, a thin-film transistor 200 overlapping the capacitor 300 may include a source electrode and a drain electrode. The source electrode and the drain electrode of the thin-film transistor 200 overlapping the capacitor 300 respectively contacts a source region and a drain region of the active layer 210 at a location other than the location shown in FIG. 1.

Although it has been described with reference to FIG. 1 that the capacitor 300 formed overlapping any one of the plurality of thin-film transistors 200 and the lower electrode 310 of the capacitor 300 functions as the gate electrode 220 of the thin-film transistor 200, the present embodiment is not limited thereto. According to another embodiment, the capacitor 300 may be formed not to overlap the thin-film transistor 200. In this case, the second insulating layer 140 may not be interposed between the gate electrode 220 and the source and drain electrodes 230s and 230d.

A fourth insulating layer 160 may be formed on the source and drain electrodes 230s and 230d. The fourth insulating layer 160 may include an organic material such as a general-purpose polymer (polymethylmethacrylate (PMMA) or polystyrene (PS)), a polymer derivative having a phenol group, an acrylic-group polymer, an imide-group polymer, an aryl ether-group polymer, an amide-group polymer, a fluorine-group polymer, a p-xylene-group polymer, a vinyl alcohol-group polymer, or a blend thereof. The pixel electrode 170 may be electrically connected to any one of the source and drain electrodes 230s and 230d through a contact hole formed in the fourth insulating layer 160.

A pixel-defining layer 180 having an opening, which covers an edge of the pixel electrode 170 and defines each pixel region, may be formed on the fourth insulating layer 160. The intermediate layer 20 may be formed in the opening of the pixel-defining layer 180.

The intermediate layer 20 may include an organic emission layer including an organic material for emitting red, green, or blue light. The intermediate layer 20 may have a multi-layer structure including the organic emission layer. For example, the organic material may be a low- or high-molecular weight organic material. According to the organic material included in the organic emission layer, the intermediate layer 20 may further include at least one selected from the group consisting of a hole transport layer, a hole injection layer, an electron transport layer, and an electron injection layer. Although FIG. 1 shows a case where the intermediate layer 20 may be formed only in the opening of the pixel-defining layer 180, the present embodiment is not limited thereto. According to another embodiment, some layers forming the intermediate layer 20 may be formed to correspond to the whole surface of the substrate 110, and the other layers may be patterned to correspond to the opening. The opposite electrode 30 may be formed on the intermediate layer 20 and may be a common electrode formed to correspond to the whole surface of the substrate 110.

The ID mark 410 formed in the ID mark area IDA may be patterned to have first information. For example, the ID mark 410 may be formed for each pixel (or pixel area), and in this case, the first information may contain information about a pixel, e.g., location information of the pixel. The ID mark 410 may be formed in a pattern such as barcode, quick response (QR) code, DataMatrix, MaxiCode, VeriCode, Codablock, or Aztec Code, but types of the ID mark 410 are not limited. The ID mark 410 may be formed in the same layer as the active layer 210 of the thin-film transistor 200. The ID mark 410 may be formed at the same time as the active layer 210 of the thin-film transistor 200 may be formed, and may include the same material as the source region 210s and the drain region 210d of the active layer 210. A partial region of the ID mark 410, which may be formed when the ID mark 410 is patterned, may be filled with the material forming the first insulating layer 130.

In more detail, the alignment mark 410 of FIG. 1 can include a first portion 410a spaced-apart from a second portion 410b. A portion 130a of the first insulating layer 130 may fill a space between the first portion 410a and the second portion 410b of ID mark 410. In other words, the second portion 410b is spaced-apart from first portion 410a by portion 130a of first insulating layer 130. As a result, metal layer 420 makes contact with the upper surface of each of the first portion 410a and second portion 410b of ID mark 410 as well as an upper surface of portion 130a of the first insulating layer 130. Thus, the partial region of ID mark 410 is filled with portion 130a of first insulating layer 130.

The metal layer 420 may be formed directly on the ID mark 410. The ID mark 410 may be exposed through a hole H formed in at least one insulating layer, e.g., the first to third insulating layers 130, 140, and 150, covering the ID mark 410, and the metal layer 420 may directly contact an upper surface of the ID mark 410, which is exposed through the hole H. A size of the metal layer 420 may be formed to be the same as or greater than that of the ID mark 410 so that the metal layer 420 reflects light irradiated to recognize the ID mark 410.

The metal layer 420 may be formed of a reflective metal and may be formed, for example, in the same layer and the same material as the source and drain electrodes 230s and 230d of the thin-film transistor 200. According to an embodiment of the present invention, since the metal layer 420 may be formed directly on the ID mark 410, the metal layer 420 may directly reflect light irradiated to recognize the ID mark 410, thereby improving a recognition ratio of the ID mark 410. The ID mark 410 and the metal layer 420 will now be described in detail with reference to FIGS. 2 to 3B.

Figure 2:
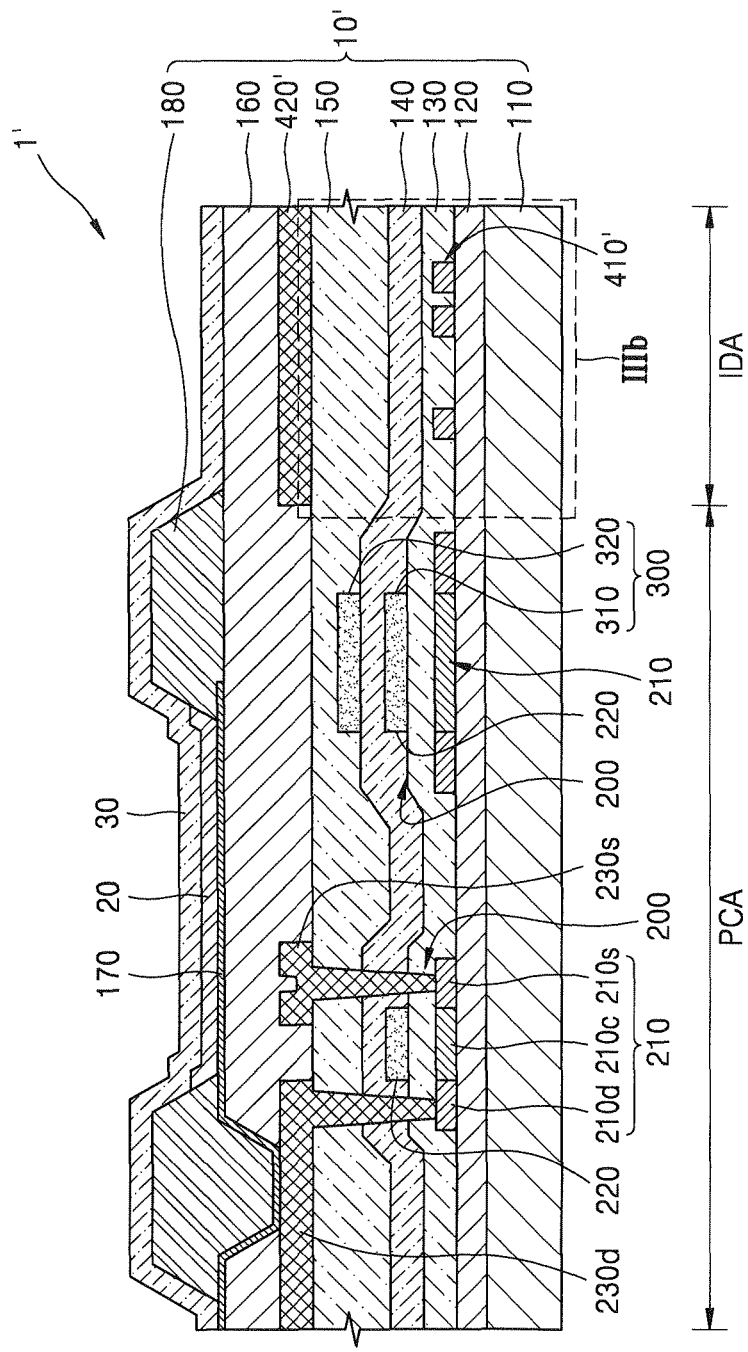
FIG. 2 is a cross-sectional view of a display apparatus including a thin-film transistor substrate, according to a comparative example.
Figure 3A:
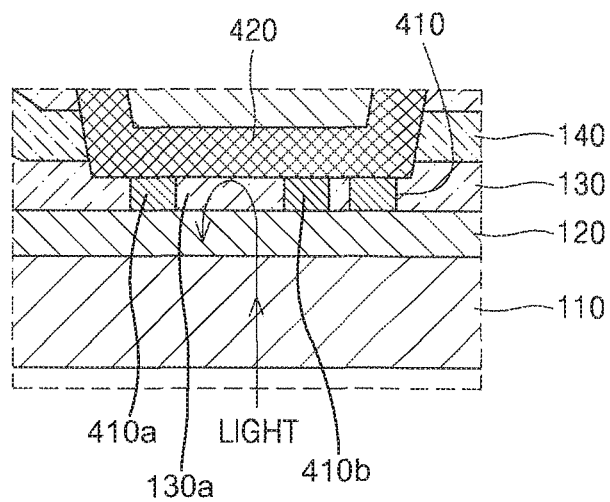
FIG. 3A is a magnified cross-sectional view of IIIa of FIG. 1.
Figure 3B:
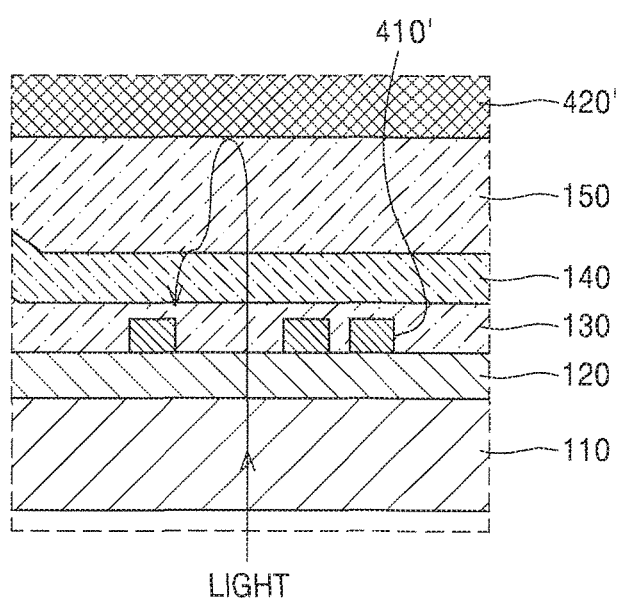
FIG. 3B is a magnified cross-sectional view of IIIb of FIG. 2.

FIG. 2 is a cross-sectional view of a display apparatus 1' including a thin-film transistor substrate 10', according to a comparative example of the present invention, FIG. 3A is a magnified cross-sectional view of IIIa of FIG. 1, and FIG. 3B is a magnified cross-sectional view of IIIb of FIG. 2.

Referring to FIGS. 2 and 3B, in the thin-film transistor substrate 10' (or the display apparatus 1') according to the comparative example, a plurality of insulating layers 140 and 150 are interposed between an ID mark 410' and a metal layer 420'.

To recognize the ID mark 410 or 410', a method of recognizing information included in the ID mark 410 or 410' by receiving light reflected from the metal layer 420 or 420' among light incident to the ID mark 410 or 410' from a rear surface of the substrate 110 may be used. In the comparative example, since the plurality of insulating layers 140 and 150 are interposed between the ID mark 410' and the metal layer 420', a portion of light may be refracted while moving through the plurality of insulating layers 140 and 150 or become extinct by the plurality of insulating layers 140 and 150, thereby decreasing a recognition ratio of the ID mark 410'.

However, according to an embodiment of the inventive concept and as illustrated in FIG. 3A, since the metal layer 420 may be formed directly on the ID mark 410, light traveling towards the ID mark 410 is reflected directly from the metal layer 420. That is, since no insulating layers are interposed between the ID mark 410 and the metal layer 420, a recognition ratio of the ID mark 410 may be improved.

In more detail, the alignment mark 410 of FIG. 3A is not a solid mark but can include a first portion 410a spaced-apart from a second portion 410b. A portion 130a of the first insulating layer 130 may fill a space (i.e. the partial region) between the first portion 410a and the second portion 410b of ID mark 410. In other words, the second portion 410b is spaced-apart from first portion 410a by portion 130a of first insulating layer 130. As a result, metal layer 420 makes contact with the upper surface of each of the first portion 410a and second portion 410b of ID mark 410 as well as an upper surface of portion 130a of the first insulating layer 130. Thus, the partial region of ID mark 410 is filled with portion 130a of first insulating layer 130.

Figure 4B:
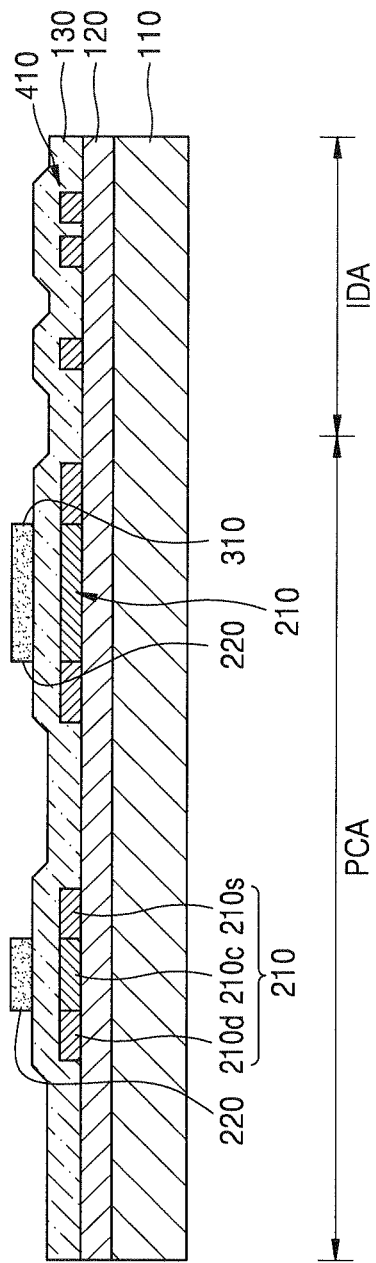
Figure 4C:
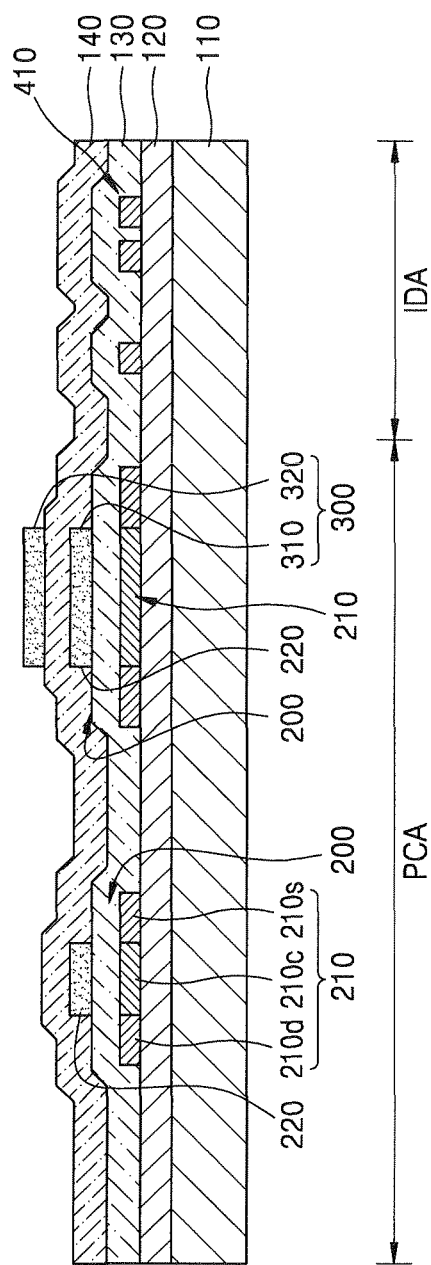
Figure 4D:
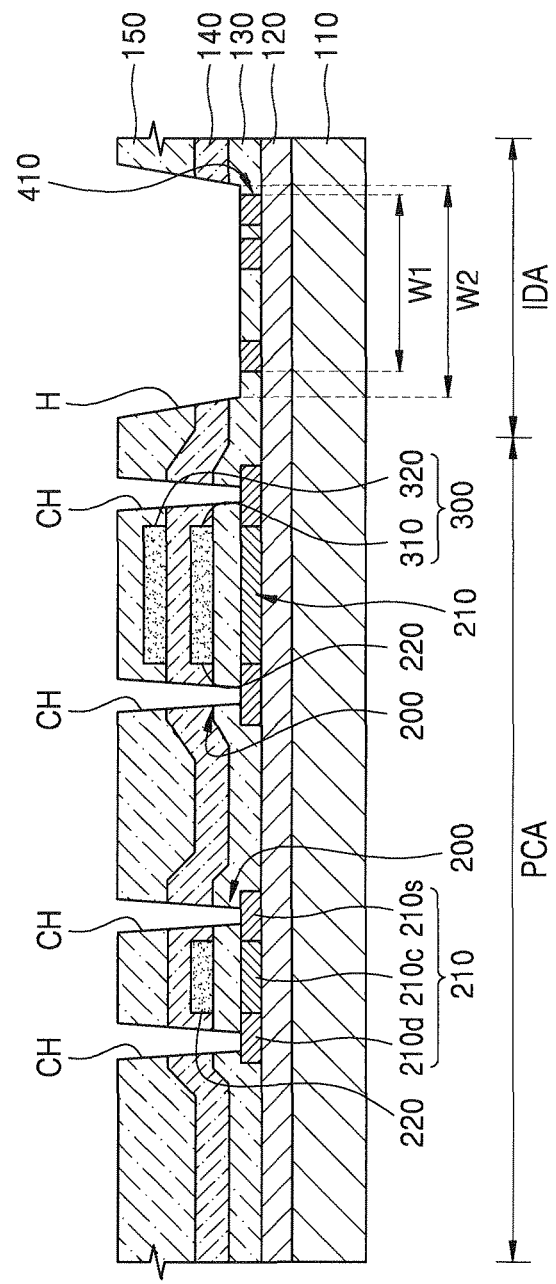
Figure 4E:
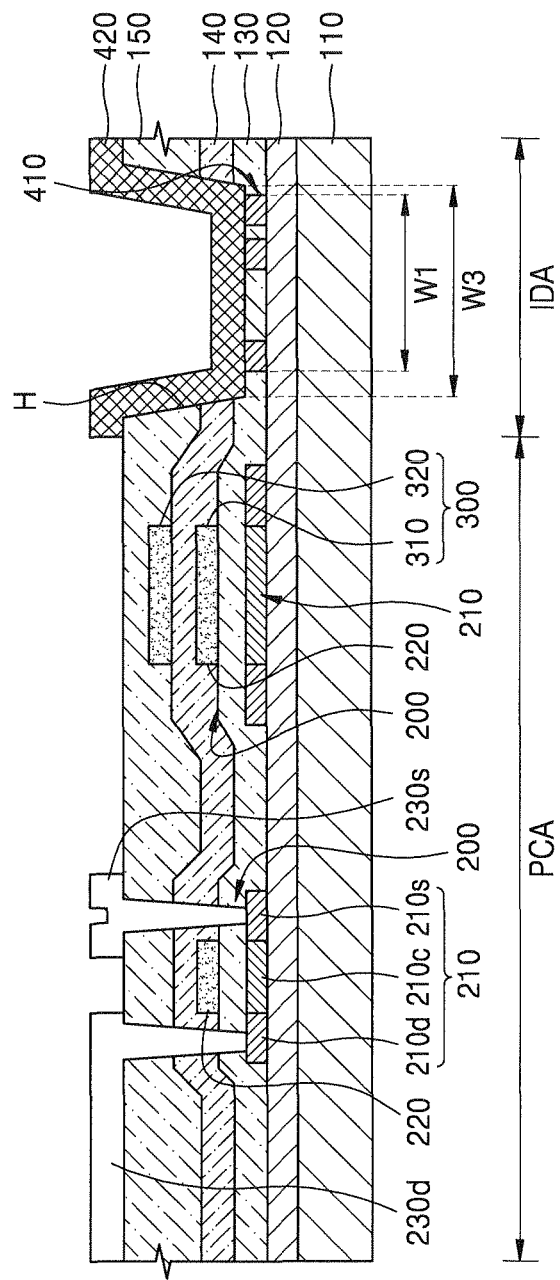
Figure 4F:
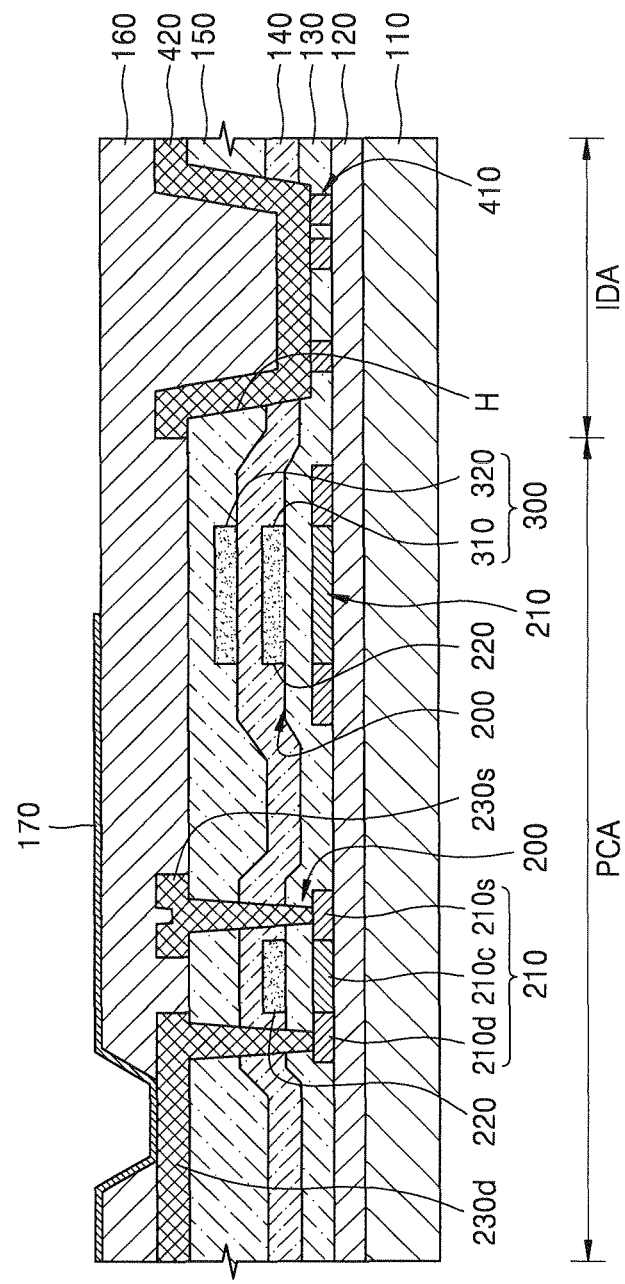
Figure 4G:
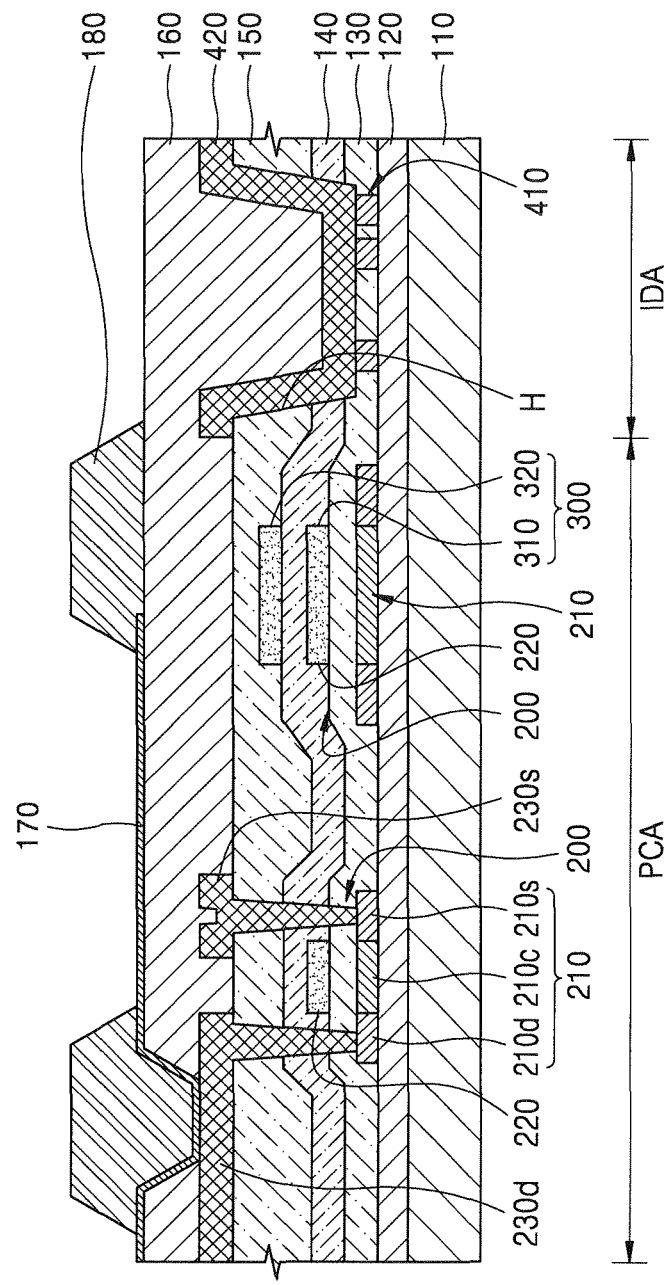
Figure 4H:
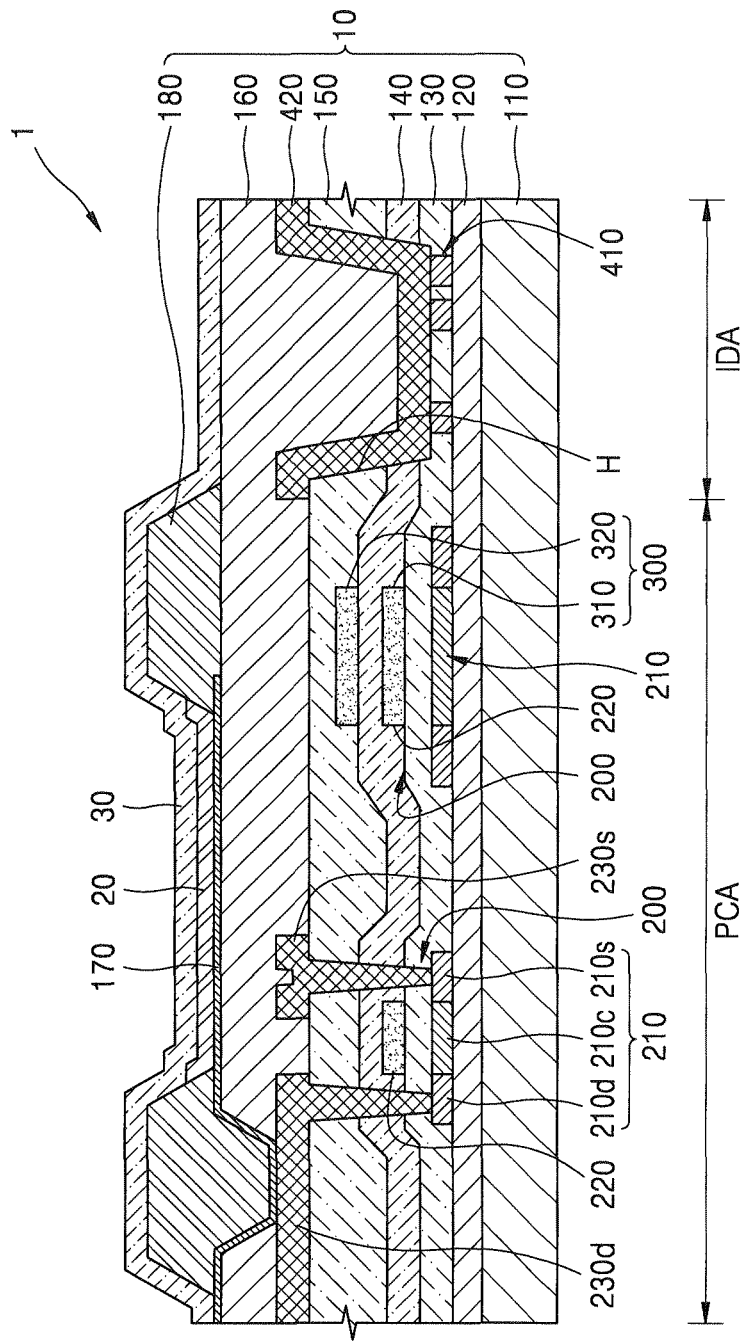
FIG. 4H is a cross-sectional view of a method of manufacturing a display apparatus, according to an embodiment.

FIGS. 4A to 4G are cross-sectional views for describing a method of manufacturing the thin-film transistor substrate 10, according to an exemplary embodiment of the present invention, and FIG. 4H is a cross-sectional view of a method of manufacturing the display apparatus 1, according to an exemplary embodiment of the present invention.

Referring to FIG. 4A, the buffer layer 120 may be formed on the substrate 110. The substrate 110 may be formed of a glass material or a plastic material, and the buffer layer 120 may be formed of inorganic material(s) such as silicon nitride ($SiN_x$) and/or silicon oxide ($SiO_x$), in a single layer or multiple layers.

A semiconductor layer (not shown) may be formed on the substrate 110, and patterned to form the active layer 210 on the pixel circuit area PCA and the ID mark 410 on the ID mark area IDA (first masking process). The active layer 210 and the ID mark 410 may be simultaneously formed in a same masking process. The ID mark 410 may be formed in the same layer as the active layer 210.

The semiconductor layer may be formed of crystalline silicon, but the present embodiment is not limited thereto. According to another embodiment, the semiconductor layer may include amorphous silicon or an oxide semiconductor.

The ID mark 410 may be formed for each pixel (or pixel area) and may include information about a pixel, e.g., location information of the pixel. The ID mark 410 may be formed in a pattern such as barcode, QR code, DataMatrix, MaxiCode, VeriCode, Codablock, or Aztec Code, but types of the ID mark 410 are not limited.

Referring to FIG. 4B, the first insulating layer 130, which may be a gate insulating layer, may be formed, and then a metal layer (not shown) may be formed and patterned to form the gate electrode 220 (second masking process). The first insulating layer 130 may be formed of an inorganic material such as, for example, $SiO_2$, $SiN_x$, SiON, $Al_2O_3$, $TiO_2$, $Ta_2O_5$, $HfO_2$, $ZrO_2$, BST, or PZT. The ID mark 410 may be patterned to have first information, and a partial region of the ID mark 410, which may be formed during the patterning, e.g., a partial region formed to expose the buffer layer 120, may be filled with the material forming the first insulating layer 130.

Thereafter, by using the gate electrode 220 as a self-mask, ion impurities are doped in the active layer 210 to form the source and drain regions 210s and 210d. The ion impurities may be doped with phosphorous (P) ions or boron (B) ions. The active layer 210 may include the channel region 210c, which may be an undoped region, and the source and drain regions 210s and 210d, which are respectively located at both sides of the channel region 210c and are doped with the ion impurities. Since the active layer 210 may be doped using the gate electrode 220 as a self-align mask, a separate masking process is not added. Since no layer functioning as a mask exists on the ID mark 410, the ID mark 410 may also be doped with the ion impurities, thereby including the same material as the source and drain regions 210s and 210d of the active layer 210.

Referring to FIG. 4C, the second insulating layer 140 may be formed on the gate electrode 220, and a metal layer (not shown) may be formed and patterned to form a metal electrode layer overlapping a gate electrode 220 of any one of the plurality of thin-film transistors 200 (third masking process). The second insulating layer 140 may be formed of an inorganic material such as $SiO_2$, $SiN_x$, SiON, $Al_2O_3$, $TiO_2$, $Ta_2O_5$, $HfO_2$, $ZrO_2$, BST, or PZT. The gate electrode 220 of the any one thin-film transistor 200 becomes the lower electrode 310 of the capacitor 300, the metal electrode layer becomes the upper electrode 320 of the capacitor 300, and the second insulating layer 140 may determine a capacity of the capacitor 300.

Although a process of forming the second insulating layer 140 and the capacitor 300 through the process described with reference to FIG. 4C has been described in the present embodiment, the present embodiment is not limited thereto. According to another embodiment, the third masking process described with reference to FIG. 4C may be omitted. In this case, the lower electrode 310 and the upper electrode 320 of the capacitor 300 may be simultaneously formed in the processes of forming the active layer 210 and the gate electrode 220, respectively, and the second insulating layer 140 is not formed.

Referring to FIG. 4D, the third insulating layer 150, which may be an interlayer insulating layer, may be formed, contact holes CH are respectively formed to expose the source and drain regions 210s and 210d of the active layer 210, and the hole H may be formed to expose the upper surface of the ID mark 410 (fourth masking process). The contact holes CH and the hole H are formed in a same process. According to an embodiment of the inventive concept, the third insulating layer 150 may be formed of an inorganic material such as $SiO_2$, $SiN_x$, $SiON$, $Al_2O_3$, $TiO_2$, $Ta_2O_5$, $HfO_2$, $ZrO_2$, BST, or PZT, in a single layer or multiple layers.

The contact holes CH and the hole H are formed while etching the first to third insulating layers 130, 140, and 150. A portion of the first insulating layer 130 formed directly on the ID mark 410 may be etched to expose the upper surface of the ID mark 410. A size of the hole H exposing the ID mark 410 may be formed to be the same as or greater than that of the ID mark 410. For example, a width W2 of the hole H may be equal to or greater than a width W1 of the ID mark 410.

Referring to FIG. 4E, a metal layer (not shown) may be formed and patterned to form the source and drain electrodes 230s and 230d and the metal layer 420 located directly on the ID mark 410 (fifth masking process). The source electrode 230s and the drain electrode 230d are electrically connected to the active layer 210 through the contact holes CH, respectively, and the metal layer 420 contacts the upper surface of the ID mark 410 through the hole H. The metal layer 420, the source electrode 230s, and the drain electrode 230d may be formed of a same material in a same layer by a same process. A size of the metal layer 420 may be formed to be same as or greater than that of the ID mark 410. For example, a width W3 of the lower surface of the metal layer 420 may be formed to be the same as or greater than the width W1 of the upper surface of the ID mark.

Referring to FIG. 4F, the fourth insulating layer 160 may be formed, and a via hole for exposing any one of the source electrode 230s and the drain electrode 230d may be formed (sixth masking process). The fourth insulating layer 160 may include an organic material such as a general-purpose polymer (PMMA or PS), a polymer derivative having a phenol group, an acrylic-group polymer, an imide-group polymer, an aryl ether-group polymer, an amide-group polymer, a fluorine-group polymer, a p-xylene-group polymer, a vinyl alcohol-group polymer, or a blend thereof.

Thereafter, an electrode layer (not shown) may be formed and patterned to form the pixel electrode 170 (seventh masking process). The pixel electrode 170 may be electrically connected to the any one of the source electrode 230s and the drain electrode 230d through the via hole formed in the fourth insulating layer 160.

Referring to FIG. 4G, an insulating layer (not shown) may be formed and patterned to form the pixel-defining layer 180. The pixel-defining layer 180 may include an opening defining a pixel region, and cover an edge of the pixel electrode 170. The pixel-defining layer 180 may include an organic material such as a general-purpose polymer (PMMA or PS), a polymer derivative having a phenol group, an acrylic-group polymer, an imide-group polymer, an aryl ether-group polymer, an amide-group polymer, a fluorine-group polymer, a p-xylene-group polymer, a vinyl alcohol-group polymer, or a blend thereof.

The display apparatus 1 may be manufactured by forming the intermediate layer 20 and the opposite electrode 30 on the thin-film transistor substrate 10 formed through the processes described with reference to FIGS. 4A to 4G.

Referring to FIG. 4H, the intermediate layer 20 may be formed on the pixel electrode 170 exposed through the opening of the pixel-defining layer 180. The intermediate layer 20 may include an organic emission layer including an organic material for emitting red, green, or blue light. The intermediate layer 20 may have a multi-layer structure including the organic emission layer. For example, the organic material may be a low- or high-molecular weight organic material, and the intermediate layer 20 may further include at least one selected from the group consisting of a hole transport layer, a hole injection layer, an electron transport layer, and an electron injection layer according to the organic material included in the organic emission layer.

Although FIG. 4H shows a case where the intermediate layer 20 may be formed in the opening of the pixel-defining layer 180, the present embodiment is not limited thereto. According to another embodiment, some layers forming the intermediate layer 20 may be formed to correspond to the whole surface of the substrate 110, and the other layers may be patterned to correspond to the opening. The opposite electrode 30 is formed on the intermediate layer 20 and may be a common electrode formed to correspond to the whole surface of the substrate 110.

Although an organic light-emitting display apparatus including the intermediate layer 20 and the opposite electrode 30 on the thin-film transistor substrate 10 has been described in the method of manufacturing the display apparatus 1 with reference to FIG. 6H, the present embodiment is not limited thereto. Any display apparatus including the thin-film transistor substrate 10 having the ID mark 410 and the metal layer 420 as described above may belong to the scope of the inventive concept. For example, a liquid crystal display apparatus including a liquid crystal and the opposite electrode 30 formed on the thin-film transistor substrate 10 also belongs to the scope of the inventive concept.

Although a case where the ID mark 410 and the metal layer 420 are formed for each pixel (or pixel area) has been described in the above-described thin-film transistor substrate 10 or display apparatus 1 according to an embodiment of the present invention, the present embodiment is not limited thereto. According to another embodiment, an ID mark for recognizing information on the thin-film transistor substrate 10 or the display apparatus 1 may also have the above-described structure of the ID mark 410 and the metal layer 420 according to an embodiment of the present invention.

As described above, according to a thin-film transistor substrate, a display apparatus, a method of manufacturing the thin-film transistor substrate, and a method of manufacturing the display apparatus according to the one or more of the above exemplary embodiments, a recognition ratio of an ID mark may be improved.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A thin-film transistor substrate comprising:
a substrate;
a thin-film transistor formed on the substrate, the thin-film transistor comprising an active layer, a gate electrode, a source electrode, and a drain electrode;
an identification (ID) mark on the substrate, the ID mark comprising a first portion and a second portion, the first and the second portions include a same material as the active layer;
a first insulating layer arranged on the ID mark; and
a metal layer overlapping the ID mark and contacting upper surfaces of the first portion, the second portion and a portion of the first insulating layer between the first portion and the second portion.

2. The thin-film transistor substrate of claim 1,
wherein the first insulating layer comprises a hole through which the upper surface of the ID mark is exposed, and the metal layer contacts the upper surface of the ID mark through the hole.

3. The thin-film transistor substrate of claim 1, wherein:
the active layer comprises source and drain regions disposed at both sides of a channel region and the active layer is doped with impurities, and
the ID mark comprises the same material as the source and drain regions.

4. The thin-film transistor substrate of claim 1, wherein the metal layer is formed of the same material and in the same layer as the source and drain electrodes of the thin-film transistor.

5. The thin-film transistor substrate of claim 1, the thin film transistor substrate further comprises a plurality of pixel areas, wherein the ID mark is formed for each of the pixel areas arranged on the thin-film transistor substrate.

6. The thin-film transistor substrate of claim 1, wherein a size of the metal layer is equal to or greater than that of the ID mark.

7. The display apparatus of claim 1, wherein the ID mark is formed for each pixel, and has information about a pixel for which the ID mark is formed.

8. The thin film transistor substrate of claim 1, the ID mark being formed in a pattern selected from a group consisting of a barcode, a QR code, a DataMatrix, MaxiCode, VeriCode, Codablock and Aztec code.

9. The thin film transistor substrate of claim 1, the first portion being spaced-apart from the second portion by the portion of the first insulating layer.

10. A display apparatus comprising:
a substrate;
a thin-film transistor formed on the substrate, the thin-film transistor comprising an active layer, a gate electrode, a source electrode, and a drain electrode;
a first insulating layer interposed between the active layer and the gate electrode;
a second insulating layer formed below the source and drain electrodes;
a pixel electrode electrically connected to one of the source electrode and the drain electrode;
an identification (ID) mark on the substrate, the ID mark comprising a first portion and a second portion, the first and the second portions include a same material as the active layer; and
a metal layer overlapping the ID mark and contacting upper surfaces of the first portion, the second portion and a portion of the first insulating layer between the first portion and the second portion.

11. The display apparatus of claim 10, further comprising a hole penetrating through the first and second insulating layers,
wherein the metal layer contacts an upper surface of the ID mark through the hole.

12. The display apparatus of claim 10, wherein the metal layer is formed of the same material and in the same layer as the source and drain electrodes.

13. The display apparatus of claim 10, the ID mark being formed in a pattern selected from a group consisting of a barcode, a QR code, a DataMatrix, MaxiCode, VeriCode, Codablock and Aztec code.

14. A method of manufacturing a thin-film transistor substrate, the method comprising:
forming an active layer on a substrate;
forming an identification (ID) mark on the substrate, the ID mark comprising a first portion and a second portion;
forming a first insulating layer on the active layer and the ID mark, a portion of the first insulating layer being between the first portion and the second portion;
forming a gate electrode on the active layer;
forming a second insulating layer covering the gate electrode;
forming source and drain electrodes contacting the active layer; and
forming a metal layer overlapping the ID mark and contacting upper surfaces of the first portion, the second portion and the portion of the first insulating layer.

15. The method of claim 14, further comprised of:
forming a contact hole penetrating through the first and second insulating layers so as to expose a portion of the active layer before the forming of the source and drain electrodes; and
forming a hole penetrating through the first and second insulating layers so as to expose the upper surface of the ID mark before the forming of the metal layer.

16. The method of claim 15, wherein a size of the hole is equal to or greater than that of the upper surface of the ID mark.

17. The method of claim 14, the ID mark being formed in a pattern selected from a group consisting of a barcode, a QR code, a DataMatrix, MaxiCode, VeriCode, Codablock and Aztec code.

18. The method of claim 14, wherein the metal layer is formed of the same material and in the same layer as the source and drain electrodes.

19. A method of manufacturing a display apparatus, the method comprised of:
forming an active layer on a substrate;
forming an identification (ID) mark on the substrate, the ID mark comprising a first portion and a second portion;
forming a first insulating layer on the active layer and the ID mark, a portion of the first insulating layer being between the first portion and the second portion;
forming a gate electrode on the active layer;

forming a second insulating layer covering the gate electrode;

forming source and drain electrodes contacting the active layer;

forming a metal layer overlapping the ID mark and contacting upper surfaces of the first portion, the second portion and the portion of the first insulating layer; and forming a pixel electrode electrically connected to one of the source electrode and the drain electrode.

20. The method of claim 19, the ID mark being formed in a pattern selected from a group consisting of a barcode, a QR code, a DataMatrix, MaxiCode, VeriCode, Codablock and Aztec code.

* * * * *